(12) United States Patent
Ma et al.

(10) Patent No.: US 9,281,393 B2
(45) Date of Patent: Mar. 8, 2016

(54) SUPER JUNCTION SEMICONDUCTOR DEVICE AND ASSOCIATED FABRICATION METHOD

(71) Applicant: Chengdu Monolithic Power Systems Co., Ltd., Chengdu (CN)

(72) Inventors: Rongyao Ma, Chengdu (CN); Tiesheng Li, San Jose, CA (US); Donald Disney, Cupertino, CA (US); Lei Zhang, Chengdu (CN)

(73) Assignee: Chengdu Monolithic Power Systems Co., Ltd., Chengdu (CN)

( * ) Notice: Subject to any disclaimer, the term of this patent is extended or adjusted under 35 U.S.C. 154(b) by 0 days.

(21) Appl. No.: 13/782,929

(22) Filed: Mar. 1, 2013

(65) Prior Publication Data

US 2014/0159143 A1  Jun. 12, 2014

(30) Foreign Application Priority Data

Mar. 2, 2012 (CN) .......................... 2012 1 0052517

(51) Int. Cl.
*H01L 29/66* (2006.01)
*H01L 29/78* (2006.01)
*H01L 29/06* (2006.01)
*H01L 29/10* (2006.01)
*H01L 29/423* (2006.01)

(52) U.S. Cl.
CPC ........ *H01L 29/7813* (2013.01); *H01L 29/0634* (2013.01); *H01L 29/1095* (2013.01); *H01L 29/4236* (2013.01); *H01L 29/66734* (2013.01); *H01L 29/7811* (2013.01); *H01L 29/0696* (2013.01); *H01L 29/42368* (2013.01)

(58) Field of Classification Search
CPC ............ H01L 29/0634; H01L 29/7813; H01L 21/28088; H01L 27/088
USPC ........................................................ 257/330
See application file for complete search history.

(56) References Cited

U.S. PATENT DOCUMENTS

| | | | | |
|---|---|---|---|---|
| 7,358,566 B2* | 4/2008 | Nakagawa | .................... | 257/332 |
| 2009/0166729 A1* | 7/2009 | Zundel et al. | ................. | 257/330 |
| 2010/0032752 A1* | 2/2010 | Hozumi | .............. | H01L 29/0634 257/331 |
| 2010/0044792 A1* | 2/2010 | Hebert | ................ | H01L 29/0623 257/341 |
| 2011/0316076 A1* | 12/2011 | Lee et al. | ....................... | 257/332 |

* cited by examiner

*Primary Examiner* — Lex Malsawma
*Assistant Examiner* — Patricia Reddington
(74) *Attorney, Agent, or Firm* — Perkins Coie LLP

(57) ABSTRACT

A semiconductor device with a substrate, an epitaxy layer formed on the substrate, a plurality of deep wells formed in the epitaxy layer, a plurality of trench gate MOSFET units each of which is formed in top of the epitaxy layer between two adjacent deep well, wherein a trench gate of the trench gate MOSFET unit is shallower than half of the distance between two adjacent deep wells, which may reduce the product of on-state resistance and the gate charge of the semiconductor device.

17 Claims, 7 Drawing Sheets

US 9,281,393 B2

SUPER JUNCTION SEMICONDUCTOR DEVICE AND ASSOCIATED FABRICATION METHOD

CROSS-REFERENCE TO RELATED APPLICATION(S)

This application claims the benefit of CN application No. CN201210052517.6, filed on Mar. 2, 2012, and incorporated herein by reference.

TECHNICAL FIELD

The present invention generally relates to semiconductor technology, and more particularly but not exclusively relates to a super junction semiconductor device and associated fabrication method.

BACKGROUND

Super junction structure may reduce the product of on-state resistance Ron and area A. Therefore the utilization of super junction structures could shrink the scale of semiconductor devices. By reducing the width of the P-type pillar or N-type pillar in a super junction structure, the on-state resistance Ron may be further decreased. When this device scale-down scheme is applied in planar metal oxide semiconductor field effect transistor (MOSFET) device, the scale of poly gate needs to be shrunk simultaneously. Thus, in planar MOSFET device, the utilization of super junction structure may also lower down the product of Ron and Qg (gate charge), and further lower down the power consumption of the gate driver circuit.

However, if the super junction structure is applied in trench-gate MOSFET, the gate charge Qg does not decrease when the width of pillar decreases. This is because the scale of the trench gate structure is not changed with the width of the pillar. As a result, a technology that could lower down the product of Ron and Qg (Ron×Qg) is desired.

SUMMARY

One embodiment of the present invention discloses a semiconductor device, comprising: a substrate; an epitaxy layer, formed on the substrate, the epitaxy layer having a first conductivity type; a plurality of deep wells, formed in the epitaxy layer, wherein the deep wells have a second conductivity type; a plurality of trench gate MOSFET units, each of the trench gate MOSFET unit formed in top of the epitaxy layer between two adjacent deep wells, wherein the top of the epitaxy layer serves as a body region, and wherein the substrate servers as a drain region; wherein each of the trench gate MOSFET unit comprises a source region and a shallow trench gate both formed in the body region, and wherein the depth of the shallow trench gate is smaller than half of the distance between two adjacent deep wells.

BRIEF DESCRIPTION OF THE DRAWINGS

Non-limiting and non-exhaustive embodiments are described with reference to the following drawings. The drawings are not depicted to scale and only for illustration purpose.

The use of the same reference label in different drawings indicates the same or like components.

DETAILED DESCRIPTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well-known methods, procedures, components, and circuits have not been described in detail so as not to unnecessarily obscure aspects of the present invention.

In the following text, the term "substrate" includes but not limited to a variation types of dies, e.g. monolithic integrated circuit die, sensor die, switch die and any other die with semiconductor property. The term "photoresist" generally refers to but not limited to a material that may occur chemical changes when exposed under electromagnetic radiation, e.g. positive photoresist which is soluble under electromagnetic radiation, and negative photoresist which is insoluble under electromagnetic radiation.

Figure 1:
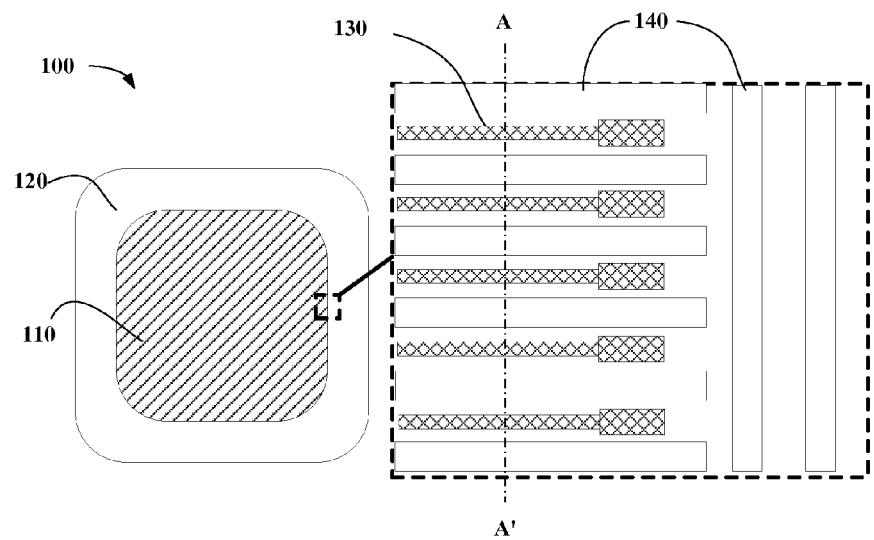
FIG. 1 schematically illustrates a layout view of semiconductor device 100 according to an embodiment of the present invention.

FIG. 1 schematically illustrates a layout view of semiconductor device 100 according to an embodiment of the present invention. The following discussion will take a power device as an example. However, one skilled in the art should understand that the present invention is not limited to power device, but also to other suitable vertical structure device.

As shown in FIG. 1, the semiconductor device 100 comprises a main cell region 110 and a termination region 120. Generally, a primary part of the vertical structure device is formed in the main cell region, and the terminals of the semiconductor device 100 are lead out by the termination region 120. Although in FIG. 1 of the present embodiment, the main cell region 110 and the termination region 120 are square shaped with round corners, one skilled in the art should understand in other embodiments, these regions may be other shaped, for example, rectangle shaped with round corners, or round shaped, etc.

The right part of the FIG. 1 is an enlarged view which illustrates a specific structure of a square area across the main cell region 110 and the termination region 120. Seen in the figure, trench gates 130 and P-type pillars (or N-type pillars) 140 are formed in alternate pattern in the main cell region 110, or in other words the pillars (deep wells) separate the trench gates apart from each other.

Figure 2:
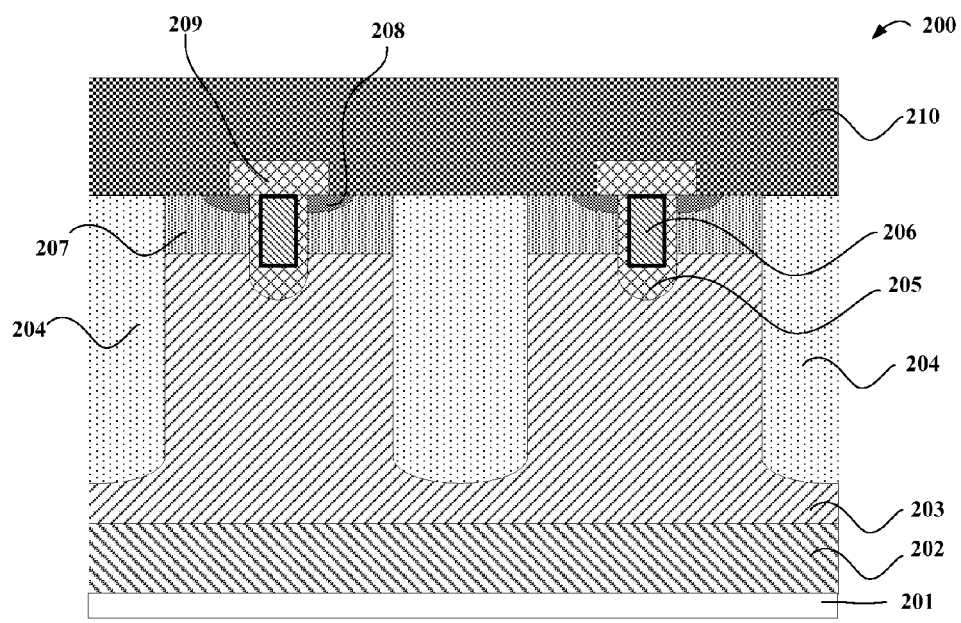
FIG. 2 schematically illustrates a cross-section view of a semiconductor device 200 along with the line A-A' shown in FIG. 1 according to an embodiment of the present invention.

FIG. 2 schematically illustrates a cross-section view of a semiconductor device 200 along the line A-A' shown in FIG.

1 according to an embodiment of the present invention. Seen in FIG. 2, the semiconductor device 200 comprises a semiconductor substrate 202, a metal layer 201 formed on the backside of the semiconductor substrate 202, an epitaxy layer 203 formed on the topside of the semiconductor substrate 202, deep wells 204 formed in the epitaxy layer 203, and each of trench gate MOSFET units formed between two adjacent deep wells 204 in top of the epitaxy layer 203. The top surface of the epitaxy layer 203 is utilized as a body region 207 and the semiconductor substrate 203 serves as drain region. Each of the MOSFET unit comprises a source region 208 and a shallow trench gate both formed in the body region 207. In one embodiment, the depth of the shallow trench gate is no more than half of the distance between adjacent deep wells 204. In another embodiment, the depth of the shallow trench gate is no more than one third of the distance between adjacent deep wells 204. Therefore the density of the trench gate and further the gate charge Qg decreases. In another embodiment, thick oxide layer is deposited both on the sidewall and the bottom side of the shallow trench gates. And ploy silicon is filled on the thick oxide layer 206 in the shallow trench gate.

According to the illustrated embodiment, a gate oxide layer 209 is formed on the trench gate and a source metal layer 210 is formed thereon. Through vias an electrical connection from the gate poly silicon to outside is established. Moreover, a metal layer is formed on the backside of the semiconductor substrate as drain electrode.

In the illustrated embodiment, the body region 207 may be positioned on the deep wells 204 so that the portions of body region of adjacent trench gate MOSFET units are connected with each other. However, in another embodiment, the deep wells 204 may separate portions of body region 207 of adjacent MOSFET units. Body region 207 is formed as shallow body region and light doped. In yet another embodiment, body region 207 is formed by applying two ion implantation steps of light doping.

According to the above embodiments, the product of Ron+ Qg may be greatly reduced. And this improvement of super junction technology may also reduce the product of Ron×A (Area). Therefore the semiconductor device according to these embodiments is proper to be applied into the area of high voltage high speed circuit.

To achieve a high accuracy doping distribution, in certain embodiments, a plurality of ion implantation steps in epitaxy layer 203 are applied to form the deep wells 204. The dose of the deepest implantation step is higher than other implantation. For example, the dose of deepest implantation step is 105%-110% of the dose of other implantations. Thus more charges are provided to the bottom of the deep wells 204 for bottom charge compensation. In some embodiments, epitaxy layer 203 is formed by a plurality of epitaxial growth steps, and followed by a plurality of ion implantation steps for each epitaxial growth step, so that a relatively excellent doping distribution of deep wells 204 may be obtained. In other embodiment, the thicknesses formed in the plurality of epitaxial growth steps are different, and wherein the thickness formed in the first epitaxial growth step is larger than that in any other epitaxial layer growth steps.

Figure 3:
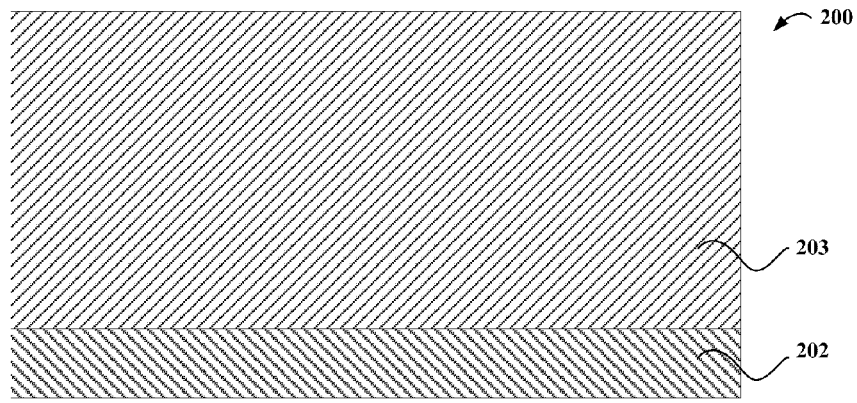
FIGS. 3-11 schematically illustrate cross-section views of a process flow for forming the semiconductor device 200 according to an embodiment of the present invention.

FIG. 3 illustrates a process flow diagram of forming epitaxy layer on the semiconductor substrate according to an embodiment of the present invention. In the following description, the substrate 202 is assumed to be an N-type substrate. However, one skilled in the art should note that in other embodiments, P-type substrate or intrinsic substrate may also be applied alternatively.

As shown in FIG. 3, the process flow according to the illustrated embodiment may comprise depositing N-type epitaxy layer 203 on the semiconductor substrate 202. The deposition process may comprise chemical vapor deposition (CVD), plasma-enhanced chemical vapor deposition (PECVD), atomic layer deposition (ALD), liquid-phase epitaxy (LPE) and/or other suitable deposition method. The term "epitaxy layer" in the following text generally but not exclusively comprises mono-crystal film or mono-crystal layer on mono-crystal substrate material. For an instance, N-type epitaxy layer 203 may comprise mono-crystal layer or other suitable semiconductor material doped with P, As, Sb or other suitable N-type dopants.

Figure 4:
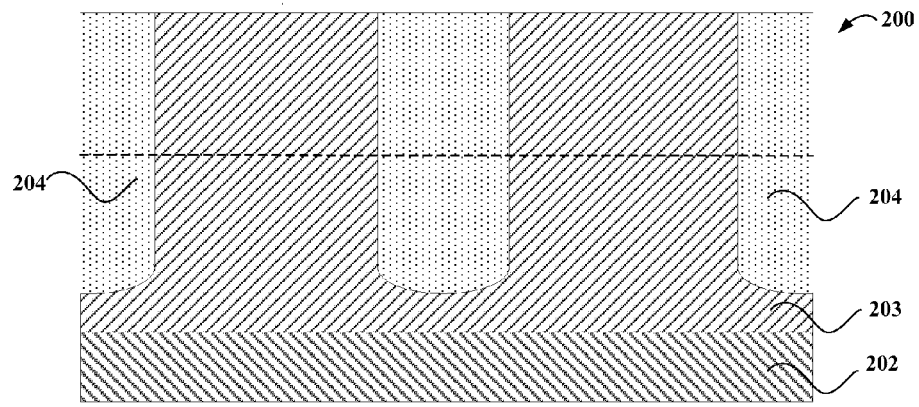

Seen in FIG. 4, after the epitaxy layer 203 is deposited, the next step of the process flow according to the illustrated embodiment comprises forming P-type pillars (P-type deep wells) 204. In some embodiments, to obtain deep wells with excellent doping distribution, the process of depositing epitaxy layer 203 and forming deep wells 204 are operated in alternative proceedings. For example, the deposition of epitaxy layer 203 may be divided into two epitaxy growth steps. After each of the plurality of growth steps, a plurality of high energy implantation steps are performed to form deep wells with excellent doping distribution. In some embodiments of the present invention, the thicknesses formed in the plurality of growth steps are different, and the thickness formed in the first growth step is thicker than those in the following steps. According to some other embodiments of the present invention, an additional surface implantation process is applied after the high energy implantation on the grown epitaxy layer to compensate the diffusion of the Boron on the surface. In yet some other embodiments, the deep wells 204 are formed by applying a plurality of ion implantation steps on the epitaxy layer 203, wherein the dose of the deepest implantation is the highest dose. Therefore, the bottom of the deep wells 204 is provided with more charges for charge compensation. Although there are 3 deep wells 204 depicted in FIG. 4, one skilled in the art should understand the number of the deep wells may vary according to different applications.

Figure 5:
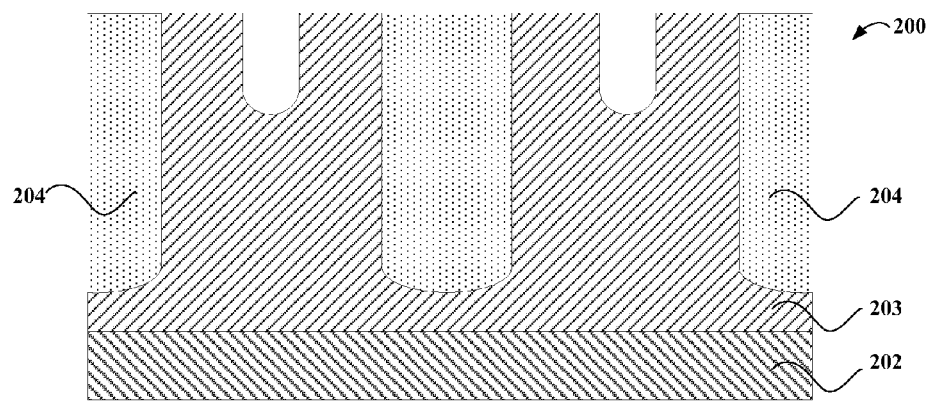

After the deep wells 204 are formed, the next process is coating photoresist on the top surface of the epitaxy layer 203 (not shown) to form trench gate. The coating process may be finished by spin-on coating and/or other well-known suitable technology. After that, the photoresist is patterned to form window. The item "pattern" in the following description generally but not exclusively is to impress a desire pattern on the photoresist layer through lithography and/or other suitable methods, and then to remove the undesired part of the photoresist layer. According to the embodiments, the window of the photoresist layer is formed on the epitaxy layer 203 between two adjacent deep wells 204, so that a portion of epitaxy layer 203 could be removed to form trench gate. As shown in FIG. 5, according to the illustrated embodiment, the depth of the trench gate is no more than half of the distance between two adjacent deep wells. In other embodiment, the depth is no more than one third of the distance. For example, the depth of the trench gate is 0.6 um-1.3 um, and distance between two adjacent deep wells 204 is 2.5-3.0 um. Therefore the gate charge Qg decreases correspondingly. Moreover, by applying high temperature oxide (HTO) CVD technology, it could deposit a 1000 Å uniform gate oxide in a relative narrow gate trench, for example, 0.6 um width. Then the gate charge Qg may be further reduced.

In yet another embodiment, a shallow junction may be formed between two adjacent deep wells. For example, the depth of the shallow junction may be smaller than 0.8 um to lower down the depth of trench gate to about 1.1 um. Thus the gate charge Qg will be further reduced.

After the trench gate is formed, the next step of the illustrated embodiment is to deposit gate oxide layer 205. According to the embodiment, the thickness of the oxide at gate trench and sidewall would be relatively high. In one embodiment, HTO CVD technology is applied to form the gate oxide layer 205.

In one embodiment, an oxide layer with a thickness of 450 Å is formed by dry-oxygen oxidation. And then an oxide layer with a thickness of about 550 Å is formed thereon by HTO CVD. By the two steps a thick (larger than 800 Å) and uniform oxide layer could be formed in a relatively narrow (e.g. 0.6 um) trench gate.

Figure 6:
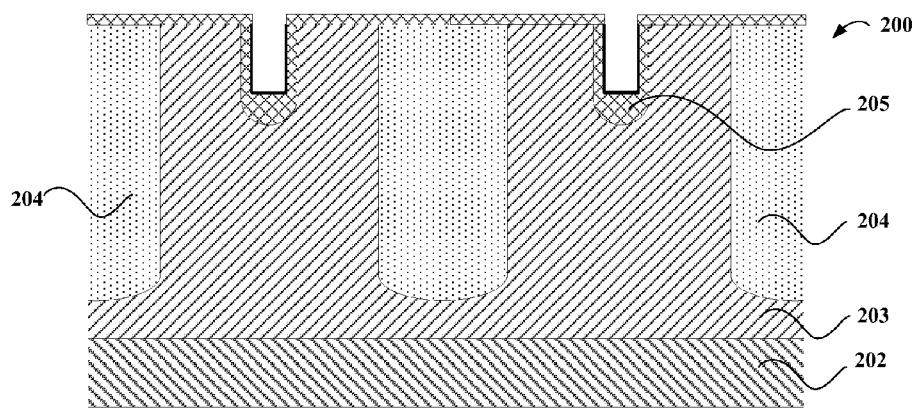

According to another embodiment of the present invention, a thicker oxide layer 205 (e.g. a thickness of 2500 Å-3000 Å) may be formed in the bottom of the trench gate. For an instance, a trench bottom oxide may be formed by high density plasma (HDP) CVD process. With such structure, the gate charge Qg is further reduced as shown in FIG. 6. The reason is, as described in the following text, when the doping concentration of body region is relatively low, e.g. $5\times10^{16}$-$9\times10^{16}$ $cm^{-3}$, the introduction of a relatively thick oxide layer 205, e.g. $SiO_2$, may reduce the gate charge Qg significantly.

Figure 7:
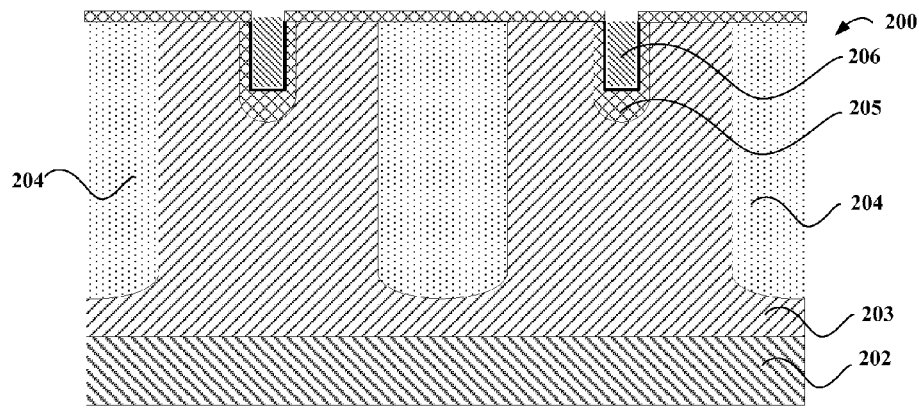

After the gate oxide layer 205 is deposited, the next step of the process flow according to the illustrated embodiment is to fill the trench gate with gate poly silicon 206. Seen in FIG. 7, in some embodiments, the formation of gate poly silicon 206 is through in-situ N+ doping. In other embodiments, the formation of gate poly silicon 206 may through ion implantation or diffusion.

Figure 8:
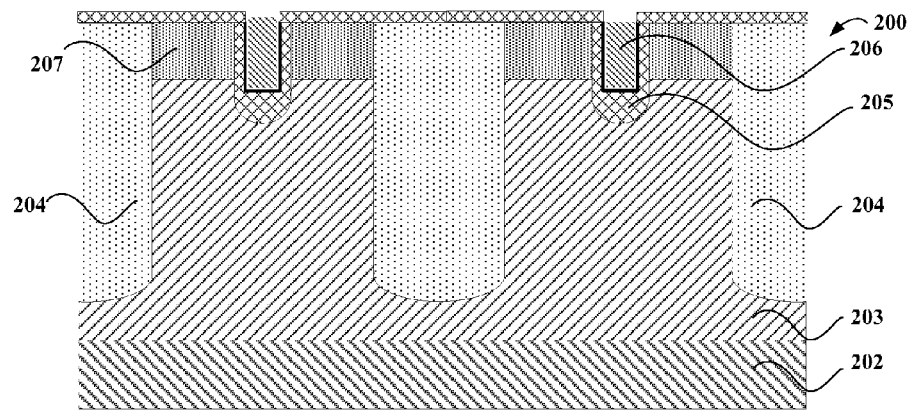
Figure 12:
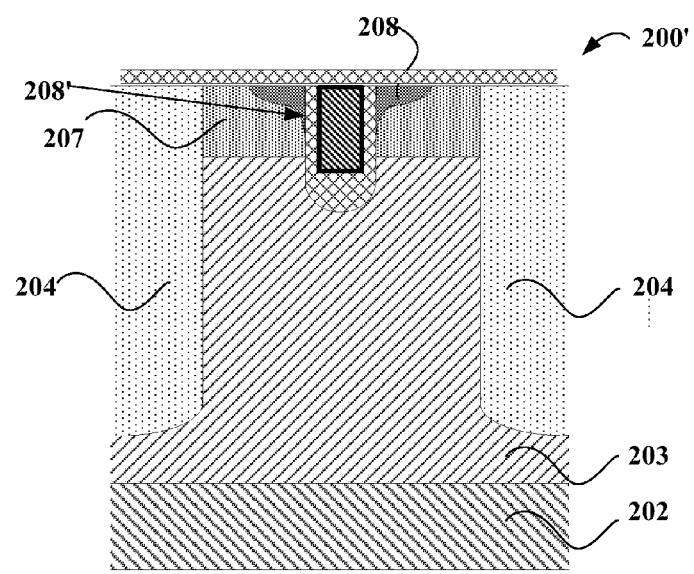
FIGS. 12-13 schematically illustrate cross-section views of an alternative process flow according to another embodiment of the present invention.

In FIG. 8, masks (not shown) may be applied for body region implantation. In one embodiment, the body region implantation applies two boron ion implantation steps with the dose of $5\times10^{12}$ $cm^{-3}$ for each, wherein one implantation step takes out a relatively shallow implantation to control the implantation depth to a position equal to the depth of source doping so that a source tail generated by the source doping region diffusing to the bottom of the trench gate as shown in FIG. 12 is prevented from forming. Then a drive-in process is applied at a temperature of 1000° C. to form a P– body region 207 in epitaxy layer 203 around the trench gate 206.

Figure 9:
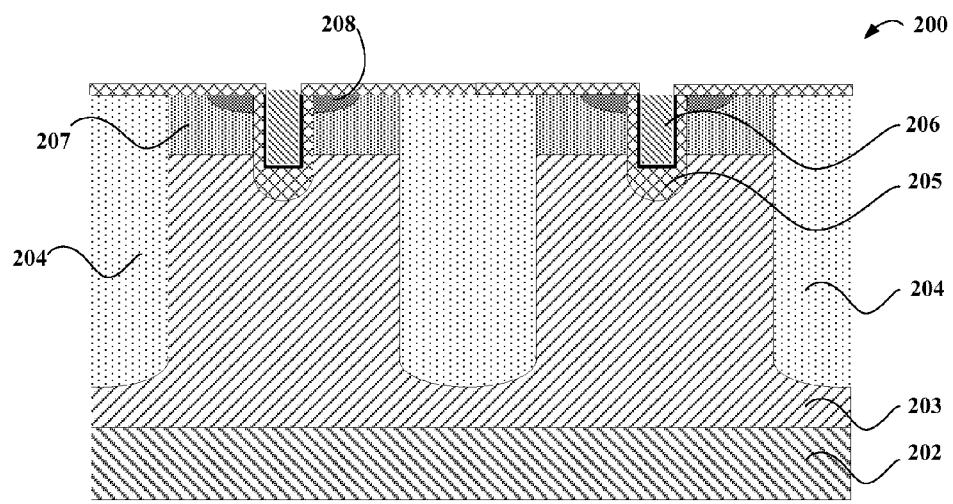

In certain embodiments, the body region 207 may be a shallow and light-doped region to reduce the channel length. FIG. 9 schematically illustrates a process flow diagram of forming a source region 208 in a body region 207. In the illustrated embodiment, it forms a mask (not shown) for source implantation to protect the P– body contact. The source implantation uses source dopant ions like As ions, with an energy of 70 KeV-80 KeV, a dose of $4\times10^{15}$ $cm^{-3}$ and an angle of zero, and then annealing is applied at about 950° C. to diffuse the dopant to form the source region 208.

Figure 10:
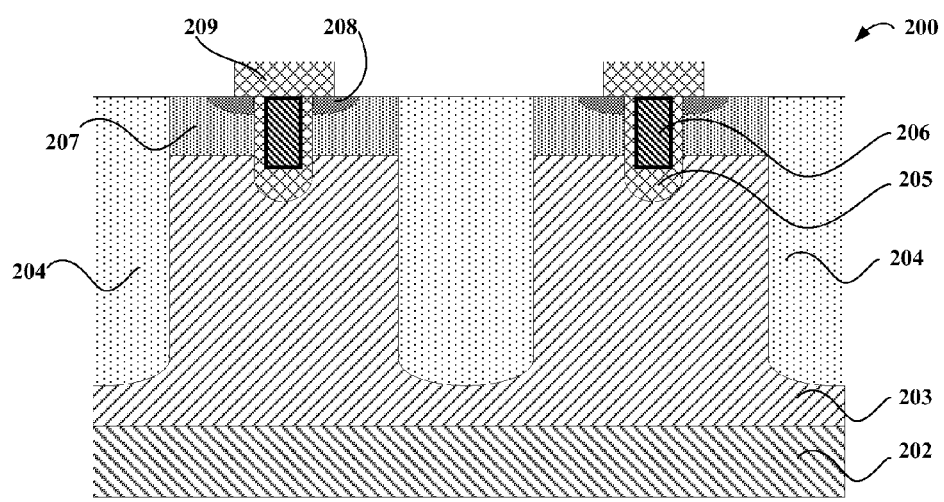
Figure 11:
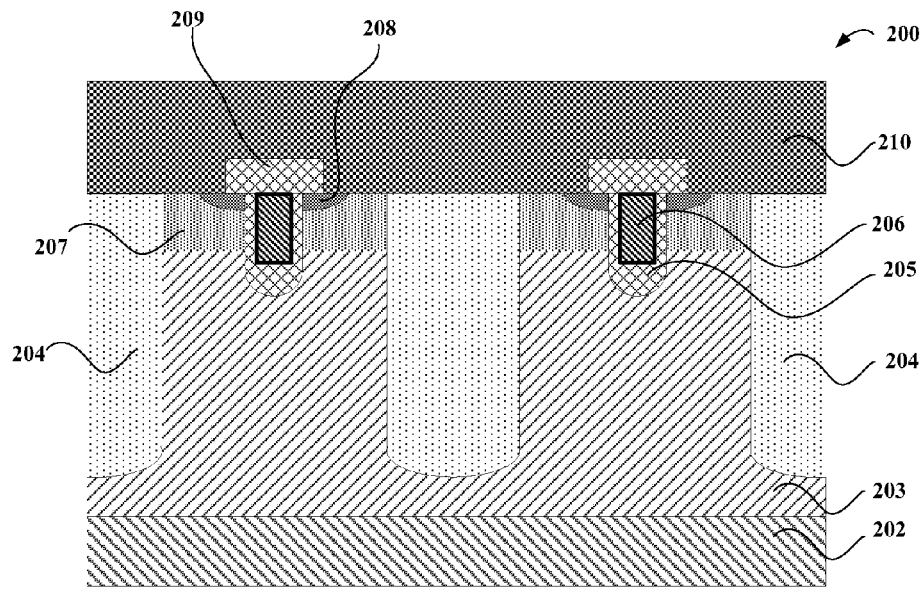

Afterward, as shown in FIG. 10, by low temperature oxide (LTO) process, a dielectric layer 209 is formed on the top surface. Then it use contact mask for oxide etching to form a contact window in dielectric layer 209. Next, as shown in FIG. 11, a thick metal layer is formed as source electrode 21. In other embodiments, before forming the thick metal layer, a barrier metal layer (not shown) may be formed. And optionally, a metal layer may also be formed at the backside of the semiconductor 202 as drain electrode.

Figure 13:
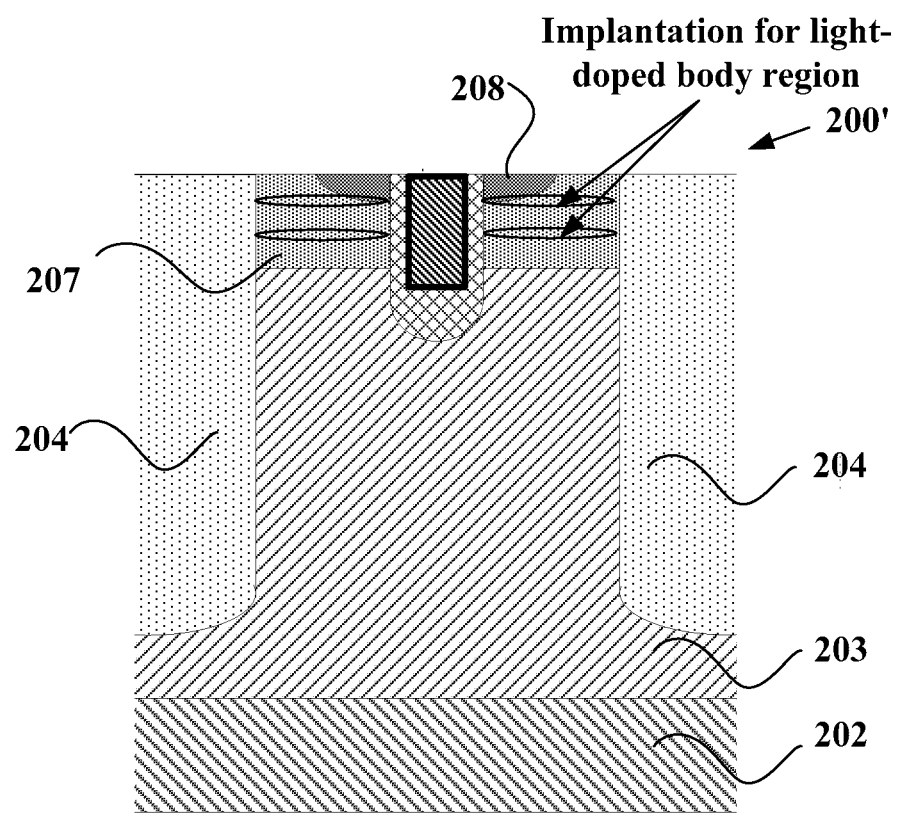

FIG. 12 and FIG. 13 illustrate a fabrication process flow of a semiconductor device 200' according to another embodiment of the present invention. Seen in FIG. 12, during the process of source region diffusion, a diffused source tail 208' may be formed along the outside of the trench gate, which may cause the body region 207 being penetrated along the outside of the trench gate. To avoid such issue, the embodiment illustrated in FIG. 13 proposes additional body region implantation steps to remove the source tail 208'. In the illustrated embodiment, a first additional body region implantation step is for preventing forming the source tail, and a second additional body region implantation step is for regulating the drain voltage.

Although the specification proposes some embodiments, it should not be understood as a limitation of the present invention. By reading the above text, one skilled in relevant art may master transformations or variations other than the described embodiments. For example, the above embodiments take n-channel device as example, however, by change the conductivity types of semiconductor region, the embodiments of the present invention may also applied in p-channel device. Therefore these transformations or variations should be included in the scope of protection of the present invention.

The above description and discussion about specific embodiments of the present invention is for purposes of illustration. However, one with ordinary skill in the relevant art should know that the invention is not limited by the specific examples disclosed herein. Variations and modifications can be made on the apparatus, methods and technical design described above. Accordingly, the invention should be viewed as limited solely by the scope and spirit of the appended claims.

We claim:

1. A semiconductor device, comprising:
    a substrate;
    an epitaxy layer, formed on the substrate, the epitaxy layer having a first conductivity type;
    a plurality of deep wells, formed in the epitaxy layer, wherein the deep wells have a second conductivity type;
    a plurality of trench gate MOSFET units, each of the trench gate MOSFET units formed in the top portion of the epitaxy layer between two adjacent deep wells, wherein the top of the epitaxy layer serves as a body region of the trench gate MOSFET unit, and wherein the substrate serves as a drain region of the trench gate MOSFET unit; and
    a source metal layer, wherein the source metal layer contacts top surfaces of the body region and the plurality of deep wells;
    wherein each of the plurality of trench gate MOSFET units comprises a source region and a shallow trench gate that are both formed in the body region, and wherein the depth of the shallow trench gate is smaller than half of the distance between the two adjacent deep wells.

2. The semiconductor device of claim 1, further comprising a thick oxide layer deposited on both a sidewall and a bottom of the shallow trench gate, and wherein the shallow trench gate is filled with poly silicon.

3. The semiconductor device of claim 1, wherein the deep wells separate the body regions of two adjacent MOSFET units.

4. The semiconductor device of claim 1, wherein the body region is a shallow and light-doped body region.

5. The semiconductor device of claim 1, wherein the body region is formed by two lightly-doped implantation steps, and wherein the depth of a shallower implantation is equal to the depth of the source region.

6. The semiconductor device of claim 1, wherein the deep wells are formed by a plurality of implantation steps in the epitaxy layer, and wherein the dose of the deepest implantation is the highest.

7. The semiconductor device of claim 6, wherein the epitaxy layer is formed by a plurality of epitaxial growth steps, and after each of the plurality of epitaxial growth steps, a plurality of implantation steps are performed.

8. The semiconductor device of claim 7, wherein the thickness of the epitaxy layer formed by the first epitaxial growth step is larger than the thickness formed by the next epitaxial growth step.

9. A semiconductor device, comprising:
a substrate;
an epitaxy layer, formed on the substrate, the epitaxy layer having a first conductivity type;
a plurality of deep wells, having a second conductivity type; and
a plurality of trench gate MOSFET units, each of the plurality of trench gate units formed in the top portion of the epitaxy layer between two adjacent deep wells, wherein the top of the epitaxy layer serves as a body region and the substrate serves as a drain region for each trench gate unit;
wherein the deep wells separate the body regions of adjacent trench gate MOSFET units and contact a source metal layer.

10. A method for forming a semiconductor device, comprising:
forming an epitaxy layer, wherein the epitaxy layer has a first conductivity type;
forming a plurality of deep wells in the epitaxy layer, wherein the deep wells have a second conductivity type; and
forming a plurality of trench gate MOSFET units, each of the plurality of trench gate MOSFET units formed in the top portion of the epitaxy layer between two adjacent deep wells, wherein the top of the epitaxy layer serves as a body region, and wherein the substrate serves as a drain region;
wherein forming each of the plurality of trench gate MOSFET units comprises forming a source region and a shallow trench gate, and wherein the depth of the shallow trench gate is smaller than half of the distance between the two adjacent deep wells.

11. The method for forming a semiconductor device of claim 10, further comprising:
depositing a thick oxide layer on a sidewall and on a bottom of the shallow trench gate; and
filling the shallow trench gate with poly silicon.

12. The method for forming a semiconductor device of claim 10, further comprising:
light-doped implanting the body region, wherein the depth of the implantation is greater than the depth of the source region.

13. The method for forming a semiconductor device of claim 10, wherein forming the deep wells comprises a plurality of implantation steps in the epitaxy layer, and wherein the dose of the deepest implantation step of the plurality of implantation steps is the highest.

14. The method for forming a semiconductor device of claim 13, wherein forming the epitaxy layer comprises applying a plurality of epitaxial growth steps, and wherein after each of the plurality of epitaxial growth steps, a plurality of implantation steps are performed.

15. The method for forming a semiconductor device of claim 14, wherein the thicknesses formed in the plurality of epitaxial growth steps are different, and wherein the thickness formed in a first epitaxial growth step is the largest.

16. The method for forming a semiconductor device of claim 15, further comprising implanting in a top surface of the epitaxy layer.

17. The semiconductor device of claim 1, wherein the source metal layer further contacts top surfaces of the source region.

* * * * *